(12) United States Patent
Kurjanowicz

(10) Patent No.: US 7,642,138 B2
(45) Date of Patent: Jan. 5, 2010

(54) SPLIT-CHANNEL ANTIFUSE ARRAY ARCHITECTURE

(75) Inventor: Wlodek Kurjanowicz, Ottawa (CA)

(73) Assignee: Sidense Corporation, Ottawa, Ontario (CA)

( * ) Notice: Subject to any disclaimer, the term of this patent is extended or adjusted under 35 U.S.C. 154(b) by 295 days.

(21) Appl. No.: 11/877,229

(22) Filed: Oct. 23, 2007

(65) Prior Publication Data

US 2008/0038879 A1 Feb. 14, 2008

Related U.S. Application Data

(62) Division of application No. 10/553,873, filed as application No. PCT/CA2005/000701 on May 6, 2005, now Pat. No. 7,402,855.

(60) Provisional application No. 60/568,315, filed on May 6, 2004.

(51) Int. Cl.
*H01L 21/82* (2006.01)
(52) U.S. Cl. ............... 438/131; 438/281; 257/E21.625
(58) Field of Classification Search ............... 438/131, 438/281, 467, 600, 981; 257/E21.625
See application file for complete search history.

(56) References Cited

U.S. PATENT DOCUMENTS

| | | | |
|---|---|---|---|
| 3,423,646 A | 1/1969 | Cubert et al. | |
| 3,634,929 A | 1/1972 | Yoshida et al. | |
| 4,322,822 A | 3/1982 | McPherson | |
| 4,507,757 A | 3/1985 | McElroy | |
| 4,543,594 A | 9/1985 | Mohsen et al. | |
| 4,823,181 A | 4/1989 | Mohsen et al. | |
| 4,899,205 A | 2/1990 | Hamdy et al. | |
| 5,019,878 A | 5/1991 | Yang et al. | |
| 5,068,696 A | 11/1991 | Yang et al. | |
| 5,110,754 A | 5/1992 | Lowrey et al. | |
| 5,163,180 A | 11/1992 | Eltoukhy et al. | |
| 5,241,496 A | 8/1993 | Lowrey et al. | |
| 5,258,947 A | 11/1993 | Sourgen | |
| 5,442,589 A | 8/1995 | Kowalski | |
| 5,646,438 A | 7/1997 | Frerichs | |
| 5,672,994 A | 9/1997 | Au et al. | |
| 5,742,555 A | 4/1998 | Marr et al. | |
| 5,925,904 A * | 7/1999 | Schmidt et al. ............. 257/296 |

(Continued)

FOREIGN PATENT DOCUMENTS

EP 0089457 A 9/1983

OTHER PUBLICATIONS

European Patent Application No. 05743122.3: search report dated Jul. 2, 2009.

(Continued)

*Primary Examiner*—Hoai v Pham
(74) *Attorney, Agent, or Firm*—Shin Hung; Borden Ladner Gervais LLP

(57) ABSTRACT

An anti-fuse memory cell having a variable thickness gate oxide. The variable thickness gate oxide has a thick gate oxide portion and a thin gate oxide portion, where the thing gate oxide portion has at least one dimension less than a minimum feature size of a process technology. The thin gate oxide can be rectangular in shape or triangular in shape. The anti-fuse transistor can be used in a two-transistor memory cell having an access transistor with a gate oxide substantially identical in thickness to the thick gate oxide of the variable thickness gate oxide of the anti-fuse transistor.

8 Claims, 11 Drawing Sheets

U.S. PATENT DOCUMENTS

| | | |
|---|---|---|
| 6,087,707 A | 7/2000 | Lee et al. |
| 6,369,422 B1 | 4/2002 | Lojek |
| 6,515,344 B1 | 2/2003 | Wollesen |
| 6,531,410 B2 | 3/2003 | Bertin et al. |
| 6,580,145 B2 | 6/2003 | Wu et al. |
| 6,597,234 B2 | 7/2003 | Reber et al. |
| 6,611,040 B2 | 8/2003 | Gelsomini et al. |
| 6,627,970 B2 | 9/2003 | Fuller et al. |
| 6,667,902 B2 | 12/2003 | Peng |
| 6,671,040 B2 | 12/2003 | Fong et al. |
| 6,713,839 B2 | 3/2004 | Madurawe |
| 6,933,557 B2 | 8/2005 | Lojek |
| 6,940,751 B2 | 9/2005 | Peng et al. |
| 2002/0027822 A1 | 3/2002 | Candelier et al. |
| 2002/0074616 A1 | 6/2002 | Chen et al. |
| 2002/0185694 A1 | 12/2002 | Ooishi |
| 2003/0071315 A1 | 4/2003 | Peng |
| 2003/0109090 A1 | 6/2003 | Bertin et al. |
| 2003/0202376 A1 | 10/2003 | Peng et al. |
| 2003/0206467 A1 | 11/2003 | Peng et al. |
| 2004/0004269 A1 | 1/2004 | Fifield et al. |
| 2004/0023440 A1 | 2/2004 | Ito et al. |
| 2004/0156234 A1 | 8/2004 | Peng et al. |
| 2006/0244099 A1 | 11/2006 | Kurjanowicz |
| 2006/0292755 A1 | 12/2006 | Parris et al. |

OTHER PUBLICATIONS

International Search Report dated Sep. 18, 2008 from International Application PCT/CA2008/001122.

* cited by examiner

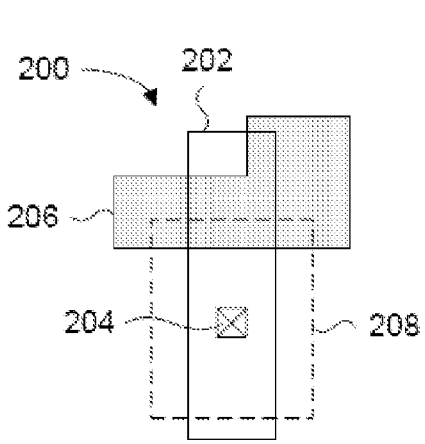
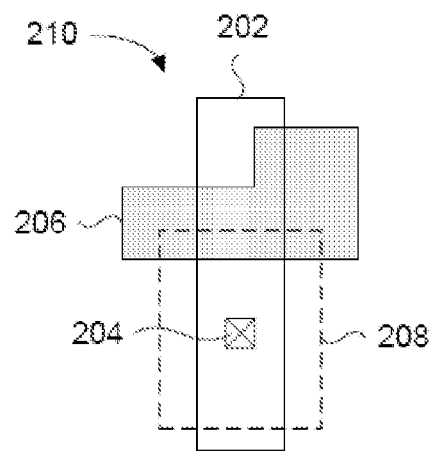
Figure 6a                Figure 6b
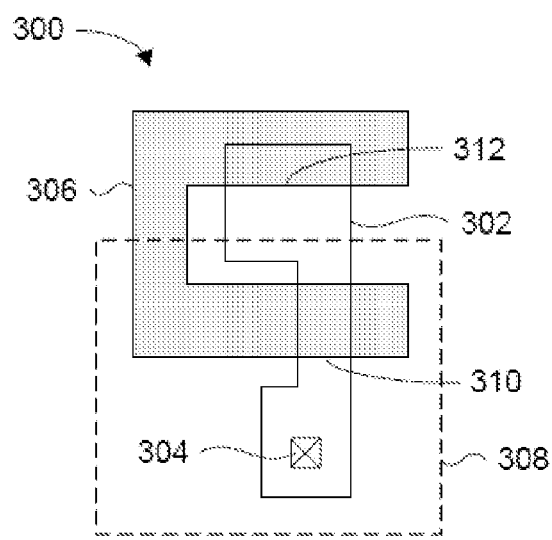
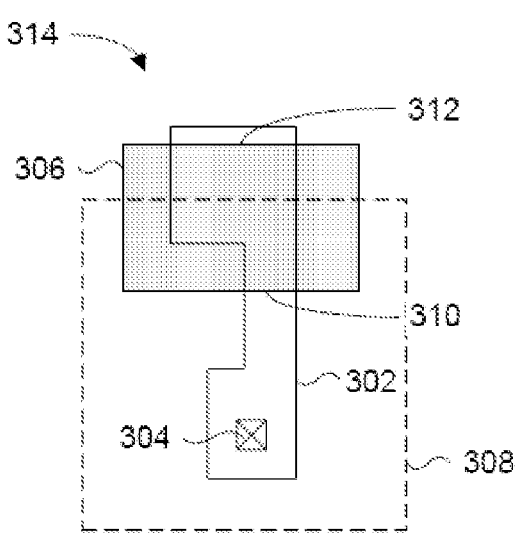
Figure 7a                Figure 7b

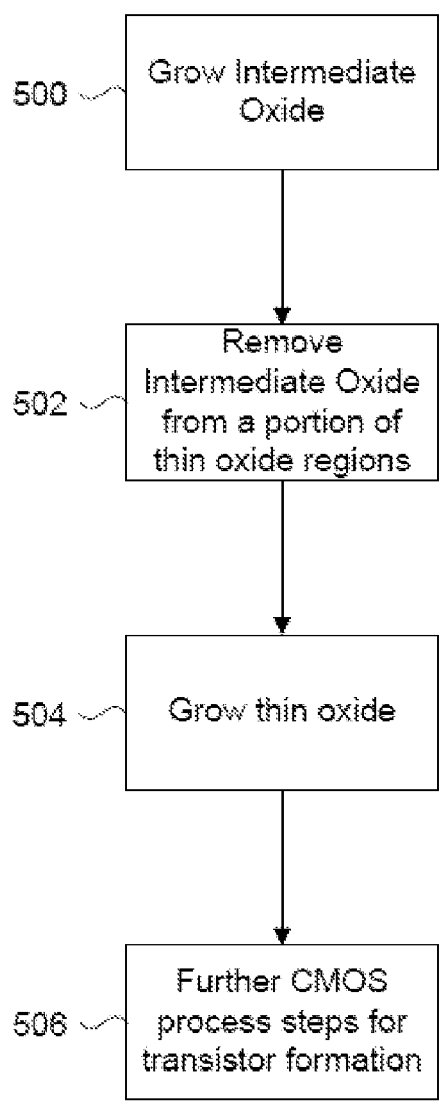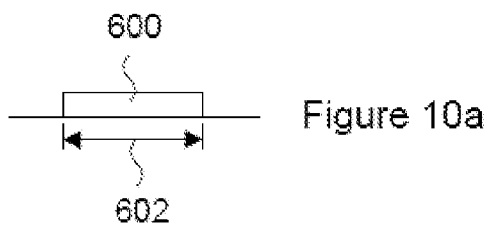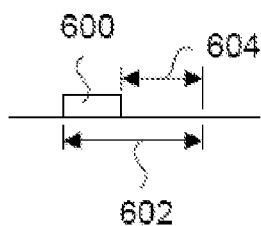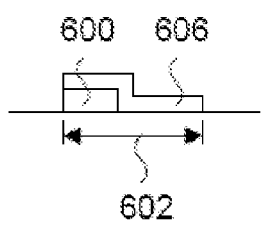
Figure 10a
Figure 10b
Figure 10c
Figure 9

SPLIT-CHANNEL ANTIFUSE ARRAY ARCHITECTURE

CROSS REFERENCE TO RELATED APPLICATIONS

This application is a divisional of U.S. patent application Ser. No. 10/553,873 filed Oct. 21, 2005, now U.S. Pat. No. 7,402,855, which claims priority from U.S. Provisional Patent Application No. 60/568,315, filed May 6, 2004.

FIELD OF THE INVENTION

The present invention relates generally to non-volatile memory cells. In particular, the present invention relates to split-channel anti-fuse transistors.

BACKGROUND OF THE INVENTION

Over the past 30 years, anti-fuse technology has attracted significant attention of many inventors, IC designers and manufacturers. An anti-fuse is a structure alterable to a conductive state, or in other words, an electronic device that changes state from not conducting to conducting. Equivalently, the binary states can be either one of high resistance and low resistance in response to electric stress, such as a programming voltage or current. There have been many attempts to develop and apply anti-fuses in microelectronic industry, but the most successful anti-fuse applications to date can be seen in FGPA devices manufactured by Actel and Quicklogic, and redundancy or option programming used in DRAM devices by Micron.

A summary of the progression of anti-fuse development follows as evidenced by issued United States patents.

Anti-fuse technology development started with U.S. Pat. No. 3,423,646, which disclosed a thin film formable diode PROM built as an array of horizontal and vertical conductors with a thin dielectric (aluminium oxide) between the conductors, at their crossings. Such NVM memory was programmed through perforation of the dielectric in some of the crossings. A formable diode would act as an open circuit until a voltage of sufficient magnitude and duration is applied to the crossing to cause forming of the aluminum oxide intermediate layer at which time device would act as a tunneling diode.

U.S. Pat. No. 3,634,929 disclosed an inter-metal semiconductor anti-fuse array, the structure of the anti-fuse consisting of a thin dielectric capacitor (AlO2, SiO2 or Si3N4) utilizing two (Al) conductors located above and connected to the semiconductor diode.

A programmable dielectric ROM memory structure using a MOS capacitor and a MOS switching element was shown in U.S. Pat. No. 4,322,822 (McPherson). This cell was formed as a standard gate-oxide-over-substrate capacitor having a gate connected to a MOS transistor using a buried contact. In order to lower the oxide breakdown voltage, which needed to be smaller for the anti-fuse capacitor then for the MOS switch, a V-shaped grove in the capacitor area was proposed. Since the capacitor was formed between the poly gate and the grounded p-type substrate, the rupture voltage had to be applied to the capacitor through an access transistor. The Gate/Drain and Gate/Source edges of the access transistors were located at the second field oxide, much thicker then the gate oxide in the channel area, which greatly improved Gate/S-D breakdown voltage.

U.S. Pat. No. 4,507,757 (McElroy) proposed a method for lowering gate oxide breakdown voltage through avalanche junction breakdown. Although the original McElroy ideas evolved around using gated diodes to locally induce avalanche breakdown, which in turn lowered dielectric rupture voltage by enhanced electron tunneling, he actually introduced or embodied other and perhaps more important elements to anti-fuse technology: (a) Dual gate oxide anti-fuse: access transistor gate oxide thicker then anti-fuse dielectric. McElroy's dual gate oxide process steps are: initial gate oxidation, etching areas for thinner gate oxide and subsequent gate oxidation. This procedure is now used in standard CMOS technologies for "I/O" and "1T" devices. (b) A "common-gate" (planar DRAM like) anti-fuse connection where access transistor connects to anti-fuse diffusion (Drain) node and all the anti-fuse gates are connected together. This is opposite to McPherson arrangement and results in much denser cell since the buried contact is eliminated. (c) Limiting resistor between common anti-fuse gate and external ground. (d) Two-terminal anti-fuse MOS device (a half transistor): McElroy concluded that only two terminals are needed in anti-fuse capacitor: D and G. The Source is not really needed for anti-fuse programming or operation and can be fully isolated from the active area. The bulk connection does not play any role either except for the avalanche breakdown. So the source role is limited to collecting carriers from the avalanche breakdown should the local substrate potential increase to forward bias the emitter of a parasitic n-p-n device formed by D, B and S.

It wasn't until 1985 when U.S. Pat. No. 4,543,594 (Mohsen) proposed an anti-fuse design suitable for redundancy repair. As such application requires much lower density than PROM, it was easier to supply external high voltage necessary to rupture the oxide without actually passing this voltage through the access transistors. Mohsen's anti-fuse structure consisted of a thin oxide (50-150 A SiO2) polysilicon capacitor over a doped region. He believed that silicon from the substrate or silicon from the electrode where a polysilicon electrode is used melts into pin holes in the insulative layer to provide the conductor, and his test data showed that where the oxide layer is approximately 100 A thick and has an area between 10 to 500 um$^2$, fusion occurred at a voltage of 12 to 16 volts. The current required to cause this fusion is less than 0.1 uA/um2 of capacitor area, and the resulting fused link has a resistance of approximately 0.5 to 2K ohms. A link, once fused, can handle currents of up to 100 milliamps at room temperature for approximately one second before it heals to an open fuse. Taking into account electron migration wear-out, the predicted wear-out lifetime of a link, once fused, is substantially greater than 3E8 hours.

The possibility of anti-fuse self-healing under current stress appeared to be the main roadblock for application of this technology in such areas like PROMs, PLDs and FPGAs, where constant fuse stress was required. The anti-fuse healing problem was resolved later by Mohsen and others at Actel in U.S. Pat. No. 4,823,181. Actel teaches the way to implement a reliable programmable low impedance anti-fuse element by using an ONO structure instead of silicon dioxide. Actel's method required an ohmic contact after dielectric rupture. This was achieved either by using heavily doped diffusion, or by putting an ONO dielectric between two metal electrodes (or silicide layers). The necessity of an Arsenic doped bottom diffusion electrode was revised later in U.S. Pat. No. 4,899,205, where it was allowed for either top-poly or bottom-diffusion to be highly doped.

U.S. Pat. No. 5,019,878 taught that if the drain is silicided, the application of a programming voltage in the range of ten to fifteen volts from the drain to the source reliably forms a melt filament across the channel region. A gate voltage may be applied to control the specific transistors to melt. IBM discovered similar effect by proposing a channel anti-fuse in U.S. Pat. No. 5,672,994. They discovered that with 0.5 um technology, the BVDSS for the nmos transistor is not only in the order of 6.5V, but once the S-D punch through occurs it creates permanent damage resulting in few kilo ohms leakage between the source and the drain.

U.S. Pat. Nos. 5,241,496 and 5,110,754 to Micron, disclosed a DRAM cell based anti-fuse (trench and stack). In 1996, Micron introduced a well-to-gate capacitor as an anti-fuse in U.S. Pat. No. 5,742,555. U.S. Pat. No. 6,087,707 proposed an N-Well coupled anti-fuse as a way to eliminate undercut defects associated with polysilicon etching. U.S. Patent Application No. 2002/0027,822 proposed a similar anti-fuse structure, but with n+ regions removed to create an asymmetrical ("unbalanced") high voltage access transistor using the N-well as a drain electrode.

U.S. Pat. No. 6,515,344 proposed a range of P+/N+ anti-fuse configurations, implemented using a minimum size gate between two opposite type diffusion regions.

NMOS anti-fuses have been built in an solated P-well using a standard Deep N-Well process. An example Deep N-Well based anti-fuses is disclosed in U.S. Pat. No. 6,611,040.

U.S. Patent Application Nos. 2002,0074,616 and 2004,0023,440 disclose other Deep N-Well anti-fuses. These anti-fuses consisted of a capacitor featuring direct tunneling current rather then Fowler Nordheim current. These applications confirm that anti-fuse performance is generally improved for thinner gate oxide capacitors (approx 20 A, which is typical for transistors in 0.13 um process).

U.S. Pat. No. 6,580,145 disclosed a new version of a traditional anti-fuse structure utilizing dual gate oxides, with the thicker gate oxide being used for nmos (or pmos) access transistors and the thinner gate oxide for the capacitor. The N-Well (or P-Well) is used as a bottom plate of the anti-fuse capacitor.

The idea of creating a source drain short through the gate by separately breaking the S-G and D-G dielectric regions of the transistor is disclosed in U.S. Pat. No. 6,597,234.

U.S. Patent Application No. 2004,0004,269 disclosed an anti-fuse built from a MOS transistor having gate connected to the gate of a capacitor, degenerated by a thinner gate oxide and heavy doping under the channel through additional implantation (a diode). The rupture voltage is applied to a bottom plate of the capacitor.

In U.S. Pat. No. 6,667,902 (Peng) Peng attempts to improve a classic planar DRAM-like anti-fuse array by introducing "row program lines" which connect to the capacitors and run parallel to the word lines. If decoded, the row program lines can minimize exposure of access transistors to a high programming voltage, which would otherwise occur through already programmed cells. Peng and Fong further improve their array in U.S. Pat. No. 6,671,040 by adding a variable voltage controlling programming current, which allegedly controls the degree of gate oxide breakdown, allowing for multilevel or analog storage applications.

Most recently, U.S. Patent Application No. 2003/0202376 (Peng) shows a memory array using a single transistor structure. In the proposed memory cell, Peng eliminates the LDD diffusion from a regular NMOS transistor. A cross-point array structure is formed of horizontal active area (S/D) stripes crossing vertical poly gate stripes. Drain contacts are shared between neighbouring cells and connected to horizontal wordlines. Source regions are also shared and left floating. Peng assumes that if the LDD diffusion is omitted, the gate oxide breakdown location will be far enough from the drain area and a local N+ region will be created rather than D-G (drain-gate) short. If such a region was created, the programmed cells could be detected by positively biasing the gate and sensing the gate to drain current. In order to reduce the G-D or S-D (source-drain) short probability, Peng proposes increasing gate oxide thickness at the G-D and S_D edges through modification of a gate sidewall oxidation process. Peng's array requires that both source and drain regions be present in the memory cells, row wordlines coupled to transistor drain regions, and the column bitlines formed from transistor gates. Such an unusual connection must be very specific to Peng's programming and reading method, requiring a decoded high voltage (8V in 1.8V process) applied to all drain lines except for the one to be programmed. The decoded high voltage (8V) is applied to the gates of the column to be programmed, while the other gates are kept at 3.3V.

Although Peng achieves a cross-point memory architecture, his array requires CMOS process modifications (LDD elimination, thicker gate oxide at the edge) and has the following disadvantages: (a) All row decoders, column decoders and sense amplifiers must switch a wide range of voltages: 8V/3.3V/0V or 8V/1.8V/0V. (b) During a program operation, the 3.3V column drivers are effectively shorted to 8V row drivers or 0V drivers through programmed cells. This puts many limits on the array size, affects driver size and impacts reliability and effectiveness of programming. (c) Every program operation requires that all the array active areas (except for the programmed row) are biased at 8V. This leads to large N++ junction leakage current, and again limits array size. (d) The gate oxide breaking spot is assumed to be located far enough from the drain area so the punch through is not happening at 8V bias. At the same time, the transistor must operate correctly at 1.8V biasing—connecting to the channel area. This is not achievable without significant process modification. (e) Peng assumes that the gate oxide will not break on the source or drain edge if the LDD is not present. It is however known in the art that the S/D edges are the most likely locations for the oxide breakdown because of defects and electric field concentration around sharp edges.

Peng attempts to solve some of the high voltage switching problems in U.S. Patent Application No. 2003/0206467. The high blocking voltage on wordlines and bitlines is now replaced with "floating" wordlines and bitlines, and restrictions on the distance from the channel to the source and drain regions has been changed. Although floating wordlines and bitlines may ease problems with high voltage switching, they do not solve any of the above mentioned fundamental problems. Additionally they introduce severe coupling problems between the switched and the floating lines.

Today, anti-fuse developments concentrate around 3-dimensional thin film structures and special inter-metal materials. All these anti-fuse technologies require additional processing steps not available in standard CMOS process, prohibiting anti-fuse applications in typical VLSI and ASIC designs, where programmability could help overcome problems with ever shrinking device life cycles and constantly rising chip development costs. Therefore there is an apparent need in the industry for a reliable anti-fuse structures utilizing standard CMOS process.

All the prior art anti-fuse cells and arrays either require special processing steps or suffer from high voltage exposure of MOS switching elements, leading to manufacturability and reliability problems. They are also limited to low density memory applications, with the exception of Peng's single transistor cell, which in turn has very doubtful manufacturability.

It is, therefore, desirable to provide a simple and reliable, high density, anti-fuse array architecture suitable for implementation in standard CMOS technology, without any additional processing steps and with limited over-voltage exposure of switching elements. It is also desirable to provide a testing method for the anti-fuse arrays to be effectively tested prior to shipment and permanent programming in the field or during manufacturing process. It is further desirable to simplify and improve such test and programming access to the anti-fuse arrays during manufacturing process.

SUMMARY OF THE INVENTION

It is an object of the present invention to obviate or mitigate at least one disadvantage of the previous anti-fuse arrays by providing a high density, low voltage anti-fuse cell structures suitable for standard CMOS manufacturing process.

In a first aspect, the present invention provides a method of forming a variable thickness gate oxide for an anti-fuse transistor. The method includes growing an intermediate oxide in a channel region of the anti-fuse transistor; removing the intermediate oxide from a thin oxide region of the channel region; and growing a thin oxide over the thin oxide region and the intermediate oxide in the channel region.

In embodiments of the present aspect, the method can include the steps of forming a common gate over the thin and intermediate oxide regions, forming a diffusion region adjacent the intermediate oxide, and forming a floating diffusion region adjacent the thin oxide region. The method can further include the steps of selectively growing a salicidation protect oxide over the diffusion region, and saliciding a portion of the polysilicon gate and the floating diffusion region.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 6a and 6b are planar layouts of an alternate anti-fuse transistor according to an embodiment of the present invention;

FIGS. 7a and 7b are planar layouts of an alternate anti-fuse transistor according to an embodiment of the present invention;

FIG. 9 is a flow chart of a method for forming a variable thickness gate oxide for the anti-fuse transistor of the present invention;

FIG. 10a-10c illustrate the formation of the variable thickness gate oxide in accordance with steps of the flow chart of FIG. 9;

DETAILED DESCRIPTION

Generally, the present invention provides a variable thickness gate oxide anti-fuse transistor device that can be employed in a non-volatile, one-time-programmable (OTP) memory array application. The anti-fuse transistor can be fabricated with standard CMOS technology, and is configured as a standard transistor element having a source diffusion, gate oxide, polysilicon gate and optional drain diffusion. The variable gate oxide underneath the polysilicon gate consists of a thick gate oxide region and a thin gate oxide region, where the thin gate oxide region acts as a localized breakdown voltage zone. A conductive channel between the polysilicon gate and the channel region can be formed in the localized breakdown voltage zone during a programming operation. In a memory array application, a wordline read current applied to the polysilicon gate can be sensed through a bitline connected to the source diffusion, via the channel of the anti-fuse transistor. More specifically, the present invention provides an effective method for utilizing split channel MOS structures as an anti-fuse cell suitable for OTP memories.

In the following description the term MOS is used to denote any FET or MIS transistor, half-transistor or capacitor structure.

Figure 1:
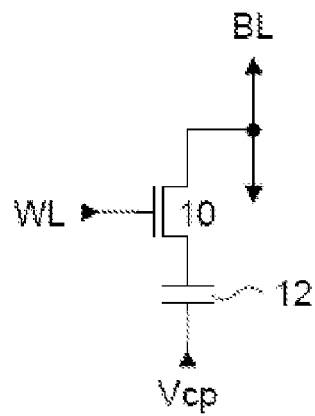
FIG. 1 is a circuit diagram of a DRAM-type anti-fuse cell.
Figure 2:
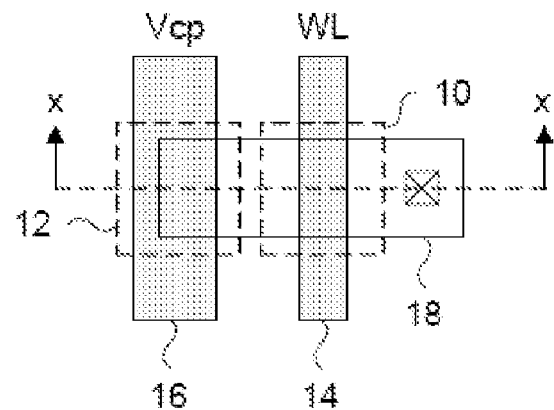
FIG. 2 is a planar layout of the DRAM-type anti-fuse cell of FIG. 1.
Figure 3:
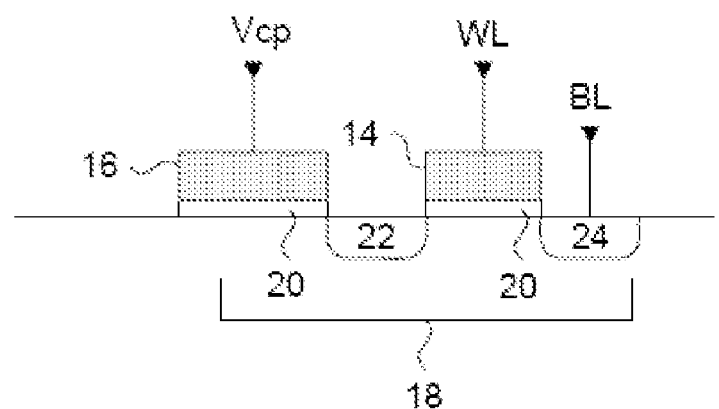
FIG. 3 is a cross-sectional view of the DRAM-type anti-fuse cell of FIG. 2 along line x-x.

As previously discussed, a DRAM-type memory array using a planar capacitors as an anti-fuse instead of as a storage capacitor is already known, as demonstrated in U.S. Pat. No. 6,667,902. FIG. 1 is a circuit diagram of such a memory cell, while FIGS. 2 and 3 show the planar and cross-sectional views respectively, of the known anti-fuse memory cell of FIG. 1. The memory cell of FIG. 1 includes a pass, or access transistor 10 for coupling a bitline BL to a bottom plate of anti-fuse device 12. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate salicidation, can be applied. While the classical single transistor and capacitor cell configuration is widely used, a transistor-only anti-fuse cell is further desirable due to the semiconductor array area savings that can be obtained for high-density applications. Such transistor-only anti-fuses must be reliable while simple to manufacture with a low cost CMOS process.

Figure 4:
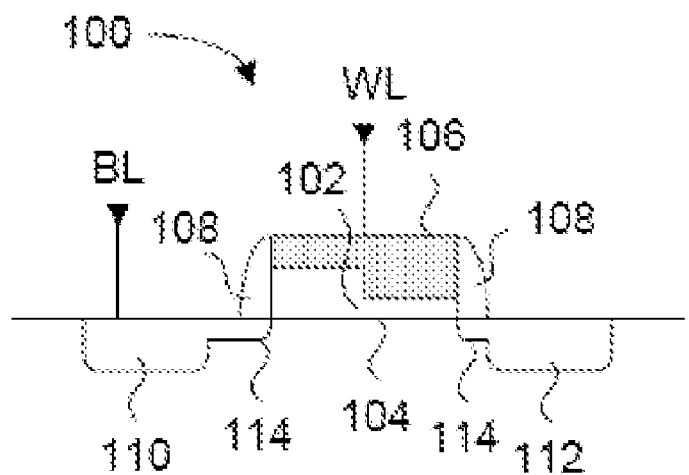
FIG. 4 is a cross-sectional view of an anti-fuse transistor according to an embodiment of the present invention.

According to an embodiment of the present invention, FIG. 4 shows a cross-sectional view of an anti-fuse transistor that can be manufactured with any standard CMOS process. In the presently shown example, the anti-fuse transistor is almost identical to a simple thick gate oxide, or input/output MOS transistor with one floating diffusion terminal. The disclosed anti-fuse transistor, also termed a split-channel capacitor or a half-transistor, can be reliably programmed such that the fuse link between the polysilicon gate and the substrate can be predictably localized to a particular region of the device. The cross-section view of FIG. 4 is taken along the channel length of the device, which in the presently described embodiment is a p-channel device. Those of skill in the art will understand that the present invention can be implemented as an n-channel device.

Anti-fuse transistor 100 includes a variable thickness gate oxide 102 formed on the substrate channel region 104, a polysilicon gate 106, sidewall spacers 108, first and second diffusion regions 110 and 112 respectively, and LDD regions 114 in each of the diffusion regions 110 and 112. The variable thickness gate oxide 102 consists of a thick oxide and a thin gate oxide such that a portion of the channel length is covered by the thick gate oxide and the remaining portion of the channel length is covered by the thin gate oxide. Generally, the thin gate oxide edge meeting diffusion region 112 defines a fusible edge where oxide breakdown can occur. The thick gate oxide edge meeting diffusion region 110 on the other hand, defines an access edge where gate oxide breakdown is prevented and current between the gate 106 and diffusion region 110 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In a preferred embodiment, the diffusion region 110 is connected to a bitline through a bitline contact (not shown), or other line for sensing a current from the polysilicon gate 106, and can be doped to accommodate programming voltages or currents. This diffusion region 110 is formed proximate to the thick oxide portion of the variable thickness gate oxide 102, while optional diffusion region 112 can be left floating. To further protect the edge of anti-fuse transistor 100 from high voltage damage, or current leakage, a resistor protection oxide (RPO), also known as a salicide protect oxide, can be introduced during the fabrication process to further space metal particles from the edge of sidewall spacer 108. This RPO is preferably used during the salicidiation process for preventing only a portion of diffusion region 110 and a portion of polysilicon gate 106 from being salicided.

It is well known that salicided transistors are known to have higher leakage and therefore lower breakdown voltage. Thus having the optional diffusion region 112 salicided will enhance oxide breakdown during programming, yet having a non-salicided diffusion region 110 will reduce leakage. Diffusion region 110 and optional diffusion region 112 can be doped for low voltage transistors or high voltage transistors or a combination of the two resulting in same or different diffusion profiles.

Figure 5:
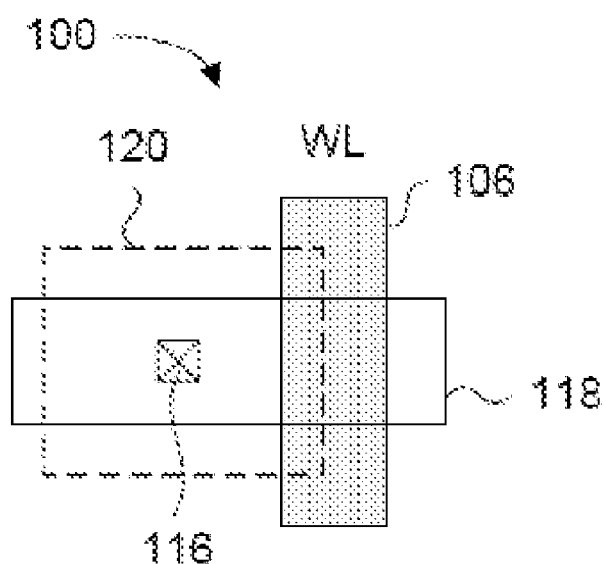
FIG. 5 is a planar layout of the anti-fuse transistor of FIG. 4.

A simplified plan view of the anti-fuse transistor 100 is shown in FIG. 5. Bitline contact 116 can be used as a visual reference point to orient the plan view with the corresponding cross-sectional view of FIG. 4. The active area 118 is the region of the device where the channel region 104 and diffusion regions 110 and 112 are formed, which is defined by an OD mask during the manufacturing process. The dashed outline 120 defines the areas in which the thick gate oxide is to be grown via an OD2 mask during the manufacturing process. OD simply refers to an oxide definition mask that is used during the CMOS process for defining the regions on the substrate where the oxide is to be formed, and OD2 refers to a second oxide definition mask different than the first. Details of the CMOS process steps for fabricating anti-fuse transistor 100 will be discussed later. It should be noted that floating diffusion region 112 is an optional structure for anti-fuse transistor 100 that can be used to enhance the probability of thin gate oxide breakdown, as will be discussed later.

Programming of anti-fuse transistor 100 is based on gate oxide breakdown to form a permanent link between the gate and the channel underneath. Gate oxide breakdown conditions (voltage or current and time) depend primarily on i) gate dielectric thickness and composition, ii) defect density, and iii) gate area, gate/diffusion perimeter. The combined thick and thin gate oxide of anti-fuse transistor 100 results in a locally lowered gate breakdown voltage, in particular an oxide breakdown zone, in the thin gate oxide portion of the device. In other words, the disclosed structure assures that the oxide breakdown is limited to the thinner gate oxide portion.

Additionally, the anti-fuse transistor embodiments of the present invention take advantage of a typically prohibited CMOS manufacturing design rule for gate oxide design layout and formation to enhance gate oxide breakdown performance. All gate oxide processing steps in today's CMOS processes assume and are optimized for uniform gate oxide thickness within the active gate area. By introducing the variable thickness gate oxide devices into the standard CMOS flow, additional defects and electrical field disturbances are created at the boundary between the thick and thin gate oxides. Those defects may include, but are not limited to: oxide thinning, plasma etching of silicon at the boundary, residues from cleaning process and silicon recess due to different thermal oxidation rates between unmasked and partially masked regions. All these effects increase trap and defect density at the thin oxide boundary, leading to increased leakage and locally lowered breakdown voltage. Therefore, a low voltage, compact anti-fuse structure can be created without any process modification.

While the anti-fuse transistor described above is suitable for OTP memory array applications due to its compact size, additional modifications can be made to anti-fuse transistor 100 to further increase thin oxide breakdown probability. As mentioned above, gate area, gate/diffusion perimeter is a factor that can increase the probability of thin gate oxide breakdown. To incorporate this breakdown mechanism, the previously shown floating diffusion region 112 can be added to the anti-fuse transistor structure, and the floating diffusion/gate perimeter is preferably increased by incorporating multiple line segments and angles to the diffusion/gate boundary. Further breakdown enhancement can be achieved by heavily doping floating diffusion region 112 to a concentration similar to diffusion regions of the high voltage transistors.

In a typical CMOS process, the diffusion regions, LDD and channel implantation are different for thin gate oxide transistors and thick gate oxide transistors. According to an embodiment of the present invention, the diffusion regions, LDD and the thin gate oxide channel implantation of the anti-fuse transistors can be either type; the low voltage type corresponding to the thin gate oxide, or the high voltage type corresponding to the thick gate oxide (I/O oxide), or both, provided that the resulting thin gate oxide threshold voltage is not greater in magnitude than the thick gate oxide threshold voltage.

Figure 8:
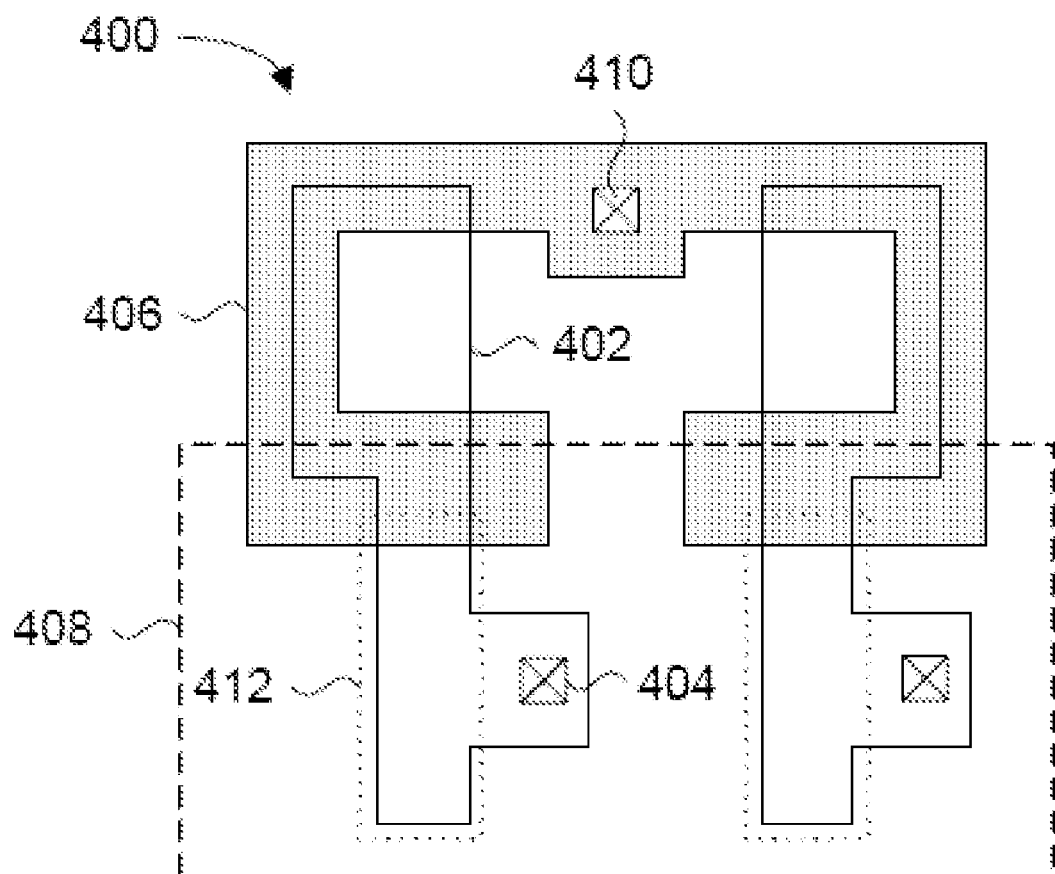
FIG. 8 is a planar layout of an alternate anti-fuse transistor according to an embodiment of the present invention.

Embodiments of the anti-fuse transistor employing increased floating diffusion region perimeter are shown in FIGS. 6-8.

FIG. 6a shows an anti-fuse transistor 200 having an "L" shaped gate/diffusion perimeter, also referred to as the fusible edge, at the floating diffusion end of the device. Anti-fuse transistor 200 is essentially the same as anti-fuse transistor 100 shown in FIGS. 4 and 5. An active region 202 has a diffusion region with bitline contact 204, and a polysilicon gate 206 formed over a variable thickness gate oxide layer (not shown). The OD2 mask 208 defines where the thick gate oxide is formed underneath polysilicon gate 206. In the present embodiment, the floating diffusion region, channel region, and polysilicon gate share a common "L" shaped edge. The edge consists of two edge segments oriented at an angle with respect to each other. While the presently shown embodiment shows the angle to be about 90 degrees, the angle can be set to 135 degrees if desired.

FIG. 6b shows an anti-fuse transistor 210 having a straight "S" shaped gate/diffusion perimeter, also referred to as the fusible edge, at the floating diffusion end of the device. Anti-fuse transistor 210 is essentially the same as anti-fuse transistor 200 shown in FIG. 6a. An active region 202 has a diffusion region with bitline contact 204, and a polysilicon gate 206 formed over a variable thickness gate oxide layer (not shown). The OD2 mask 208 defines where the thick gate oxide is formed underneath polysilicon gate 206. In the present embodiment, the floating diffusion region, channel region, and polysilicon gate share a common straight "S" shaped edge. The edge consists of three edge segments oriented at 90 degree angles with respect to each other.

FIGS. 6a and 6b illustrate examples where the polysilicon gate can be shaped to increase the floating diffusion region perimeter. FIGS. 7a and 7b illustrate examples where the diffusion region and/or the polysilicon gate can be shaped to increase the floating diffusion region perimeter.

In FIG. 7a, anti-fuse transistor 300 has a straight gate/diffusion perimeter at the floating diffusion end of the device. A shaped active region 302 has a diffusion region with bitline contact 304, and a polysilicon gate 306 formed in a "U" shape over the shaped active region 302. The OD2 mask 308 defines where the thick gate oxide is formed underneath polysilicon gate 306. Due to the narrowed active region 302, a portion of polysilicon gate 306 will form an access edge 310 that is substantially smaller in perimeter than fusible edge 312 defined by another portion of polysilicon gate 306. In this particular example, the polysilicon gate is effectively divided into two portions that are coupled to each other. The first portion forms a channel in the active area between the diffusion region with bitline contact 304, while the second portion is positioned adjacent to the floating diffusion region. The first portion is formed over thick gate oxide and the second portion is formed over thin gate oxide.

In FIG. 7b, anti-fuse transistor 314 has a straight gate/diffusion perimeter at the floating diffusion end of the device. A shaped active region 302 has a diffusion region with bitline contact 304, and a straight polysilicon gate 306 formed over the shaped active region 302. The OD2 mask 308 defines where the thick gate oxide is formed underneath polysilicon gate 306. Due to the narrowed active region 302, a portion of polysilicon gate 306 will form an access edge 310 that is substantially smaller in perimeter than fusible edge 312 defined by another portion of polysilicon gate 306.

Therefore, as shown in FIGS. 6a, 6b, 7a and 7b, the perimeter fusible edge can be increased with a combination of polysilicon gate and active area shaping to enhance thin oxide breakdown during programming operations.

FIG. 8 shows a pair of anti-fuse transistors, of which only one will be described as both are substantially symmetrical to each other. Anti-fuse transistor 400 has an active region 402 with a diffusion region with bitline contact 404. A polysilicon gate 406 formed over a variable thickness gate oxide layer (not shown). The OD2 mask 408 defines where the thick gate oxide is formed underneath polysilicon gate 406. In the present embodiment, the floating diffusion region, channel region, and polysilicon gate share a common straight "U" shaped edge. A polysilicon contact 410 is used to make electrical contact with a metal wordline. The diffusion region containing the bitline contacts 404 are oriented as shown to allow for sufficient spacing of RPO 412 from the respective contacts 404. The applicability of the paired anti-fuse transistors shown in FIG. 8 will be described later with regards to folded bitline sensing architectures.

While not shown in FIGS. 6a, 6b, 7a and 7b, an RPO can be used to ensure that the diffusion regions with the bitline contact and a portion of the polysilicon gate is free from salicidation.

A method of creating a variable thick gate oxide from a standard CMOS process according to an embodiment of the present invention, is to utilize a well known two-step oxidation process. A flow chart outlining this process is shown in FIG. 9, while FIGS. 10a-10c show the various stages of the variable thickness gate oxide formation corresponding to specific steps in the process.

First, an intermediate gate oxide is grown in all active areas determined by the OD mask in step 500. In FIG. 10a, this is shown as the formation of intermediate gate oxide 600 on the substrate, over the channel region 602. In following step 502, the intermediate gate oxide 600 is removed from all the designated thin gate oxide areas using an OD2 mask. FIG. 10b shows the remaining portion of intermediate gate oxide 600 and the future thin oxide area 604. In the last gate oxide formation step 504, a thin oxide is grown again in all active areas as originally defined by the OD mask. In FIG. 10c, the thin gate oxide 606 is grown over the intermediate gate oxide 600 and the thin oxide area 604.

As a result, the area covered by the OD2 mask during step 502 will have a gate oxide thickness being a combination of the intermediate gate oxide 600 and the final thin gate oxide 606. The same procedure can be extended for more than two oxidation steps, or other equivalent procedures can be used to produce two or more gate oxide thicknesses on the same die, which is determined by at least one thick gate oxide mask OD2.

Typically, the OD2 mask is considered a non-critical masking step, a low resolution mask is used and the design rules require a large margin of the OD2 mask over active gate areas and particularly, do not have provisions for the OD2 mask ending within the active gate area. According to the present invention, the OD2 mask ends within the active gate area creating a split-channel anti-fuse structure that features thicker gate oxide on the drain (i.e. diffusion contact) side and thinner gate oxide on the opposite side (either channel or non-connected source side). In principle, this technology requires that the gate length (polysilicon line width) should be larger then the process minimum and depends on actual OD2 mask tolerances, but otherwise does not require any process or mask grade change. The minimum gate length for the split channel anti-fuse structure can be approximated as a sum of minimum gate length for the thick and thin gate oxide. Those skilled in the art will appreciate that accurate calculations can be made based on mask tolerances, and the gate length can be minimized by tightening OD2 mask tolerances.

Once the variable thickness gate oxide has been formed, additional standard CMOS processing steps can be employed at step 506 to complete the anti-fuse transistor structure as shown in FIG. 4. This can include formation of the polysilicon gate, LDD regions, sidewall spacers, RPO, and diffusion regions, and salicidation, for example. According to a preferred embodiment of the presently discussed process, a salicidiation step is included to salicide the polysilicon gate and the floating diffusion region of the anti-fuse transistor. An RPO is formed over the diffusion region before hand to protect it from the salicidation process. As previously mentioned, the salicided floating diffusion region will enhance oxide breakdown in the region.

Now an application of the above-described anti-fuse transistor embodiments will be discussed. As mentioned earlier, the compactness of the proposed anti-fuse transistor makes it suitable for memory array applications, and more specifically, OTP memory array applications.

Figure 11A:
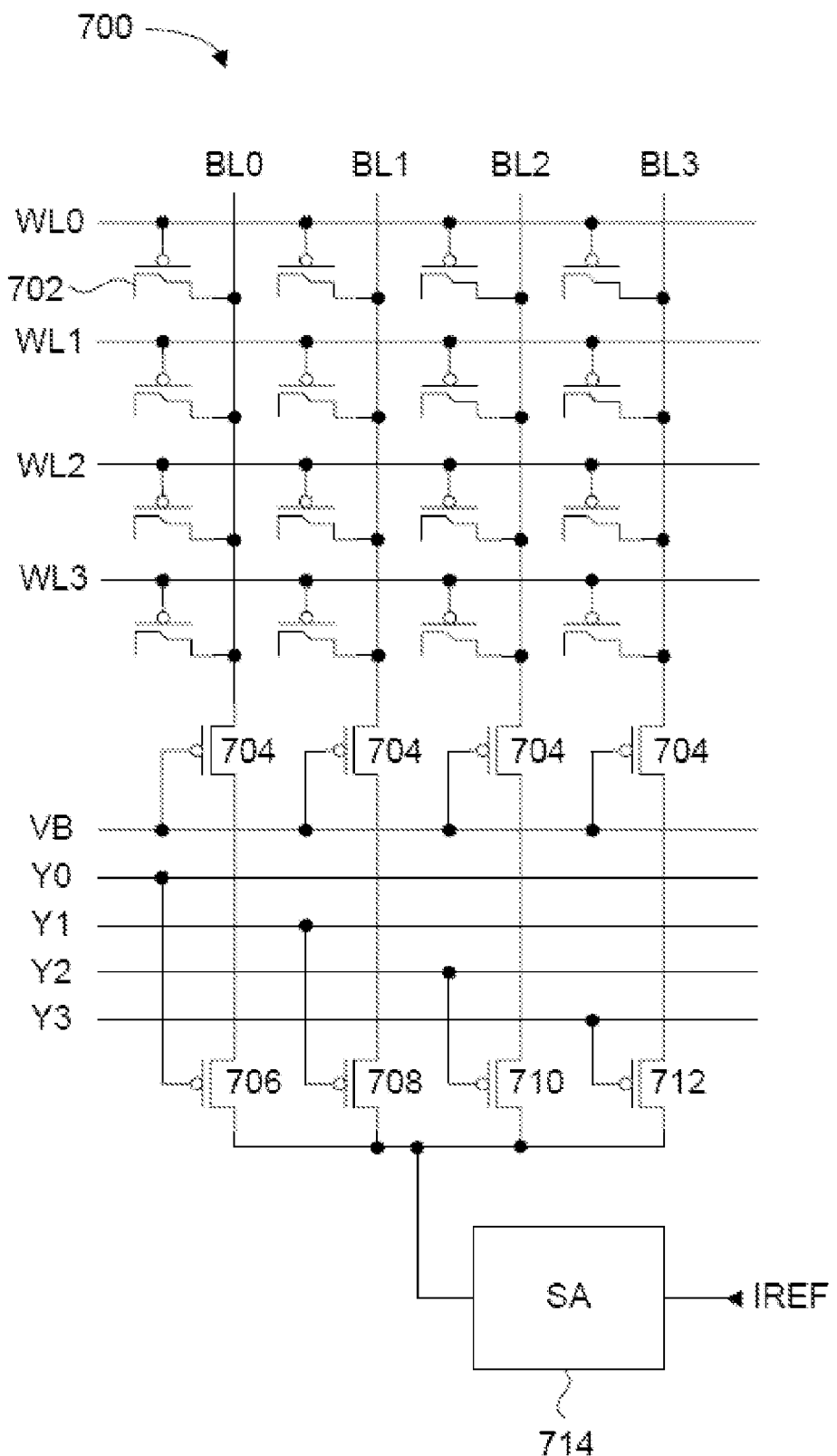
FIG. 11a is a cross-point configured anti-fuse transistor memory array configured for single-ended sensing according to an embodiment of the present invention.

FIG. 11a illustrates a plurality of anti-fuse transistor memory cells arranged in a basic cross-point array, according to an embodiment of the present invention. Sensing is single ended in the present embodiment. The anti-fuse transistor memory array 700 includes anti-fuse transistors 702 coupled to wordlines WL0-WL3 and bitlines BL0, BL1, BL2 and BL3. Anti-fuse transistors 702 can be implemented with any of the previously described anti-fuse transistors. Each bitline is connected to a p-channel isolation transistor 704, which in turn is connected to p-channel pass gates 706, 708, 710 and 712. It is noted that isolation transistors 704 are thick gate oxide transistors, where this thick gate oxide can be the same combination of the intermediate oxide and the thin gate oxide used for the anti-fuse transistor embodiments of the present invention. The gate terminal of all isolation transistors 704 receive isolation voltage VB, while the gate terminals of pass gates 706, 708, 710 and 712 receive column select signals Y0, Y1, Y2 and Y3 respectively. The column select signals perform a one of four bitline selection to couple one of the bitlines to cross-point sense amplifier 714. Cross-point sense amplifier 714 can be a current sense amplifier that compares the current of the bitline to a reference current IREF, and generally denotes single-ended sensing schemes in the present description, where a bitline voltage or current is compared to a reference signal carried on another line.

Figure 12:
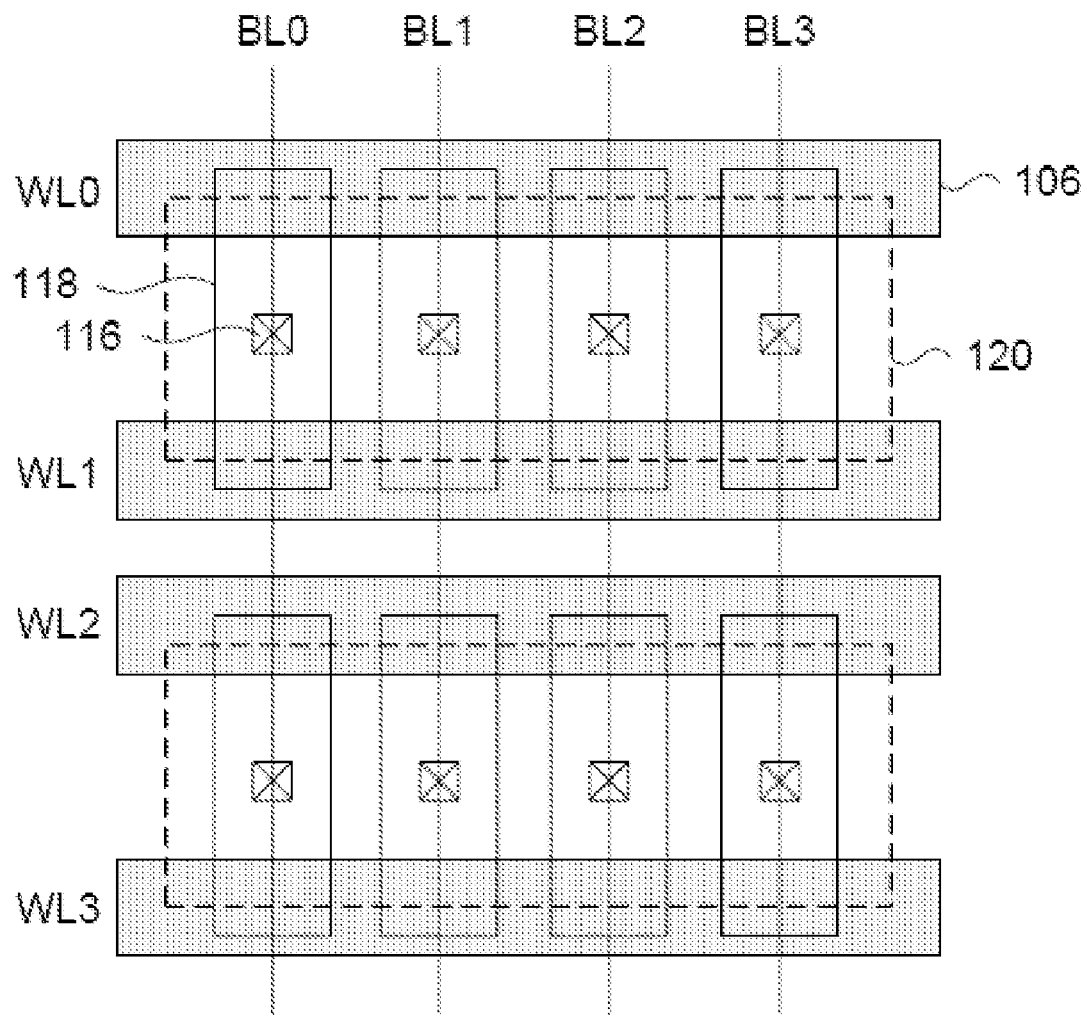
FIG. 12 is a layout of the anti-fuse transistors of the memory array shown in FIG. 11.

FIG. 12 illustrates a layout configuration of four anti-fuse transistors 702 shown in FIG. 11a. Each anti-fuse transistor of FIG. 12 have a layout similar to anti-fuse transistor 100 shown in FIG. 5, except that there is no floating source diffusion region to reduce the overall area of each cell. Accordingly, the same reference numerals are used to denote the same elements in FIG. 12. For the memory array configuration shown in FIG. 12, each bitline contact 116 and active area 118 is shared by two anti-fuse transistors, and the OD2 mask 120 is extended along the wordline direction for all the anti-fuse transistors aligned along the same row.

The anti-fuse transistors are programmed by rupturing the gate oxide, preferably at one of the thin/thick gate oxide boundary and the thin gate oxide/source diffusion edge. This is accomplished by applying a high enough voltage differential between the gate and the channel of the cells to be programmed and a substantially lower voltage differential, if any, on all other cells. Therefore, once a permanent conductive link is formed, a current applied to the polysilicon gate will flow through the link and the channel to the diffusion region, which can be sensed by conventional sense amplifier circuits.

With reference to FIG. 11a, the cell coupled to WL0 and BL0 is programmed by applying a negative voltage −VPP to WL0 and a positive voltage VPOS (or VDD) to BL0, while keeping the other wordlines at VDD and the other bitlines at 0V or another voltage significantly smaller then VPOS. This will expose the cell to be programmed to a voltage differential of V=VPOS+VPP, while all the other cells will be exposed to significantly lower voltage. Note that a positive programming voltage VPOS has to be applied to the cell to be programmed, but once programmed this cell would read as a low state. Either individual cell or multiple cells sharing the same word line can be programmed simultaneously. Although programming circuitry is not shown, those of skill in the art will understand that such circuits can be coupled to the bitlines, and incorporated into the wordline driver circuits.

Once a cell in a row has been programmed, every time the negative voltage is applied to this row for programming another cell, a short between this word line and the bit line of the programmed cell will occur pulling this the bit line towards the negative voltage. According to the present invention, the thick gate oxide isolation transistors 704 are used to isolate the bit lines from the rest of the chip, including the sense amplifiers. These devices can be un-decoded or Y-decoded. Keeping the isolation devices at ground or at the VB level allows the bit lines to float towards a negative voltage, thus having no effect on the programming operation. The voltages used for program (PGM) and read operations are summarized in Table 1 below.

TABLE 1

| | | WL | | |
|---|---|---|---|---|
| | | −VPP | VDD | 0 V or −Vtp |
| BL | VDD or VPOS | PGM | No Access | SOAK |
| | Floating or −VPP | PGM Blocked | No Access | No Access |
| | Precharge to VDD | Soft PGM | No Access | READ |

The un-programmed cells behave like switched capacitors, featuring very low leakage current. In the idle (non-accessed) state, all the word lines WL are kept at VDD, at the same level as the back-bias for the array. All the bit lines BL are also precharged to VDD and therefore, there is no leakage and no current flowing anywhere in the array even if some of the cells were programmed. To execute a read operation with memory array 700, one of the word lines is activated, by driving WL0 to 0V for example, or to another appropriate voltage sufficient for inducing a channel underneath the polysilicon gate. If the cell was not programmed, the bit line will see an increased capacitance and minimally increased leakage. On the other hand, if the cell was programmed, a relatively low resistance (500 Ohm-500 kOhm) within the cell will start discharging the bit line towards ground via the grounded WL0. This difference of behaviour can be sensed using a variety of sense amplifier designs known in the art. A simple solution is to use a current sense amplifier, such as well known sense amplifier 714 that is widely used in Flash memories, where the BL current is compared to a reference current. As the anti-fuse ON-resistance can vary significantly from cell to cell, the above-mentioned current sensing scheme requires a very precise current source of about 1 uA. Unfortunately, such small current sensing is slow and susceptible to noise.

One technique to improve the cell current through a programmed anti-fuse is by multiple programming or "soaking" the programmed cell. Cell soaking is widely known and used in non-volatile memory design, either using external programming equipment or an on-chip state machine.

Figure 11B:
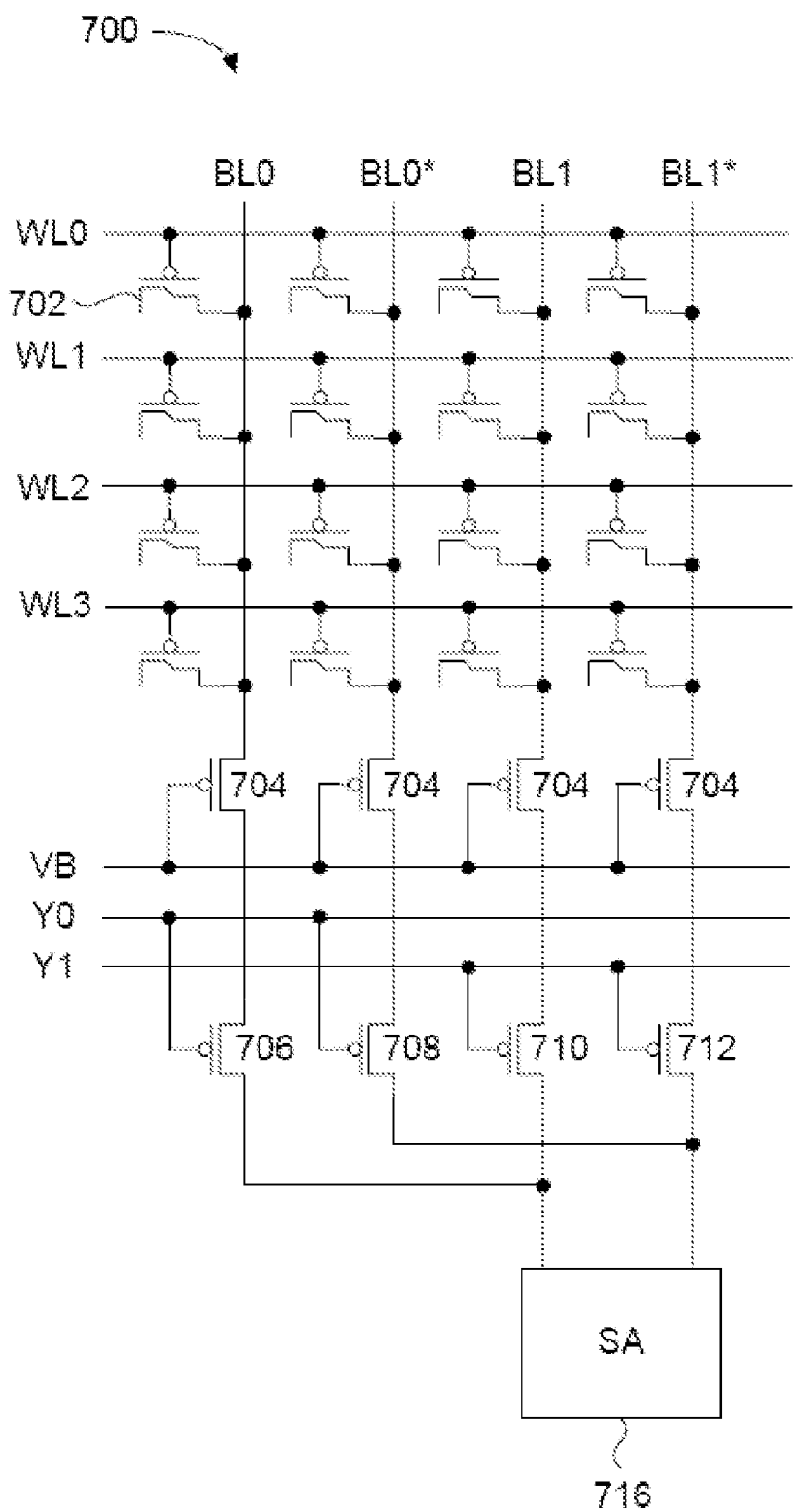
FIG. 11b is a cross-point configured anti-fuse transistor memory array configured for differential sensing according to an embodiment of the present invention.

All these complications can however be avoided by using a differential, or twin cell arrangement, where two memory cells are accessed at the same time with only one cell programmed. Accordingly, data mapping would be required to ensure that each memory cell is paired with a memory cell representing the complementary data. A typical DRAM or SRAM sense amplifier system can be used for such an arrangement. FIG. 11b illustrates another configuration of anti-fuse transistors 702 shown in FIG. 11b arranged in the twin cell configuration. The elements of FIG. 11b are essentially the same as those in FIG. 11a, with the exception of differential sense amplifier 716 which replaces cross-point sense amplifier 714, and the connection of pass gates 706, 708, 710 and 712. Pass gates 706 and 708 now have their gate terminals connected to Y0, while pass gates 710 and 712 have their gate terminals connected to Y1. Therefore, activation of Y0 will turn on both pass gates 706 and 708. The bitlines are now labelled as complementary pairs, BL0/BL0* and BL1/BL1*, where one pair of complementary bitlines is coupled to the differential sense amplifier 716 during a read operation. Those of skill in the art will understand that such a sense amplifier is a type of dual-ended sensing scheme, since either one of the bitlines connected to the differential sense amplifier 716 will typically carry a reference voltage while the other will carry data of the accessed memory cell. In the present example, the reference voltage will be the complement of the data of the memory cell being accessed.

Prior to a read operation, all the bitlines are precharged to VDD. Since the bitlines are all precharged to VDD, one of the bitlines will be pulled toward ground through a programmed cell during a read operation when one wordline is activated. Sensing data from a pair of bitlines carrying VDD and ground becomes straightforward.

Although the simple differential sensing scheme seems well suited for read operations of the programmed array, it poses tremendous test problems because the un-programmed memory array yields random and unstable data. In addition, such differential cell arrangement does not provide means for margin adjustment necessary for program verify operation. These and other drawbacks of the above described sensing architectures can be mitigated by employing a folded bitline architecture with a dual ended sensing scheme, as shown in a preferred embodiment in FIG. 13.

Figure 13:
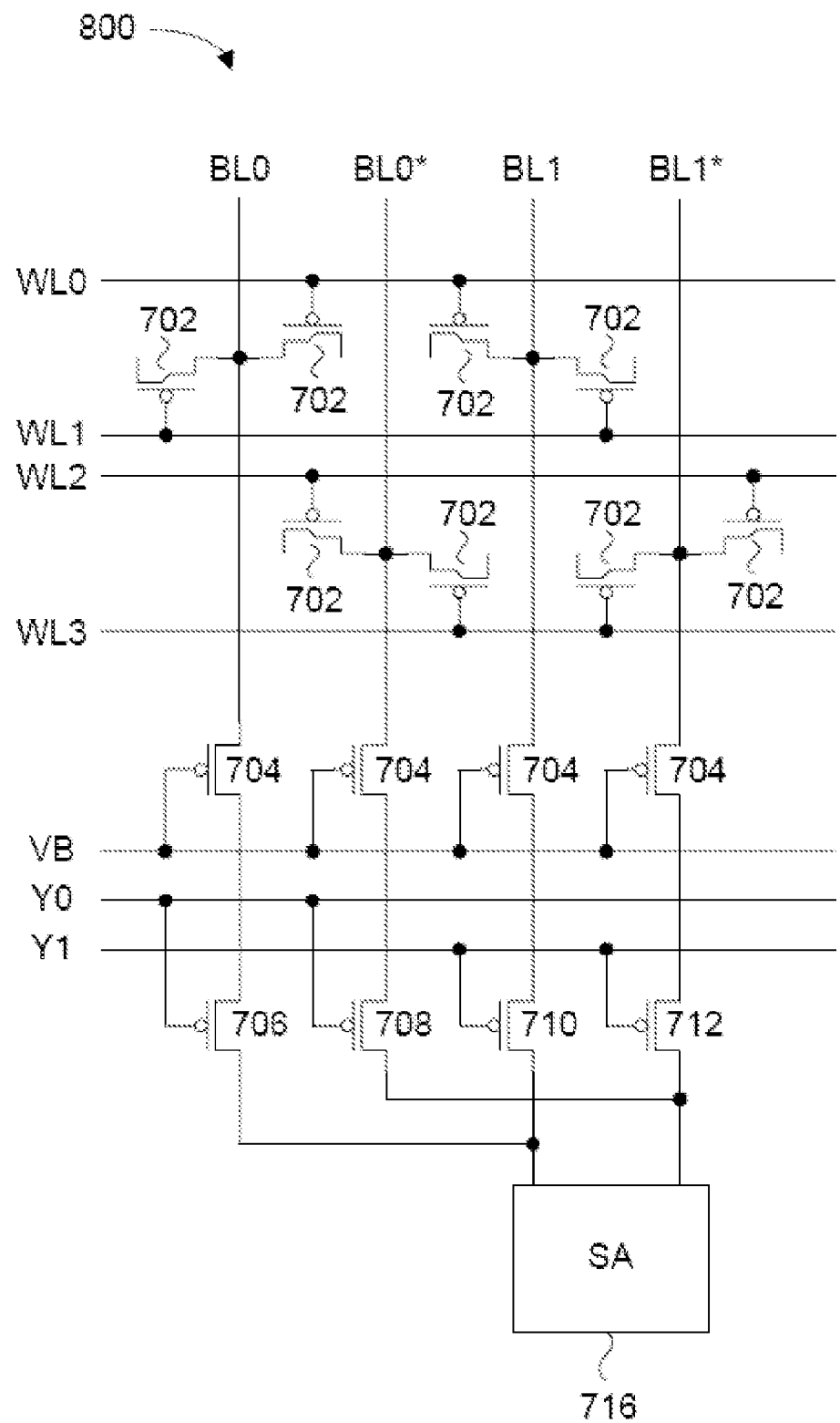
FIG. 13 is a folded bitline configured anti-fuse transistor memory array according to an embodiment of the present invention.

FIG. 13 shows a folded bitline architecture employing the previously described anti-fuse transistors 702. Memory array 800 is similar to memory array 700 of FIG. 11b, except that memory cells 702 are arranged in the folded bitline architecture.

The following is an example of a read operation of programmed data in memory array 800. It is assumed that the two anti-fuse transistors 702 located between BL0 and BL0* are used to store one bit of data, where the cell connected to WL0 is not programmed, while the cell connected to WL2 is programmed. To read these two transistor cells, WL0 and WL2 are driven to ground. Since the top cell is not programmed, BL0 will remain at the precharge level of VDD. However, since the bottom cell is programmed, BL0* will discharge towards ground through the cell. Note that the top and bottom anti-fuse transistor cells between BL1 and BL1* are also accessed. However, these bitlines are isolated from the sense amplifier since only Y0 would be driven to ground to activate pass transistors 706 and 708 and couple BL0/BL0* to folded bitline sense amplifier 716. Those of skill in the art will understand that the column select signals Y0 and Y1 can be activated at a predetermined time after the wordlines are driven, to give the bitlines time to discharge to a sufficiently low voltage level, preferably to ground to provide the largest sensing margin.

Figure 14:
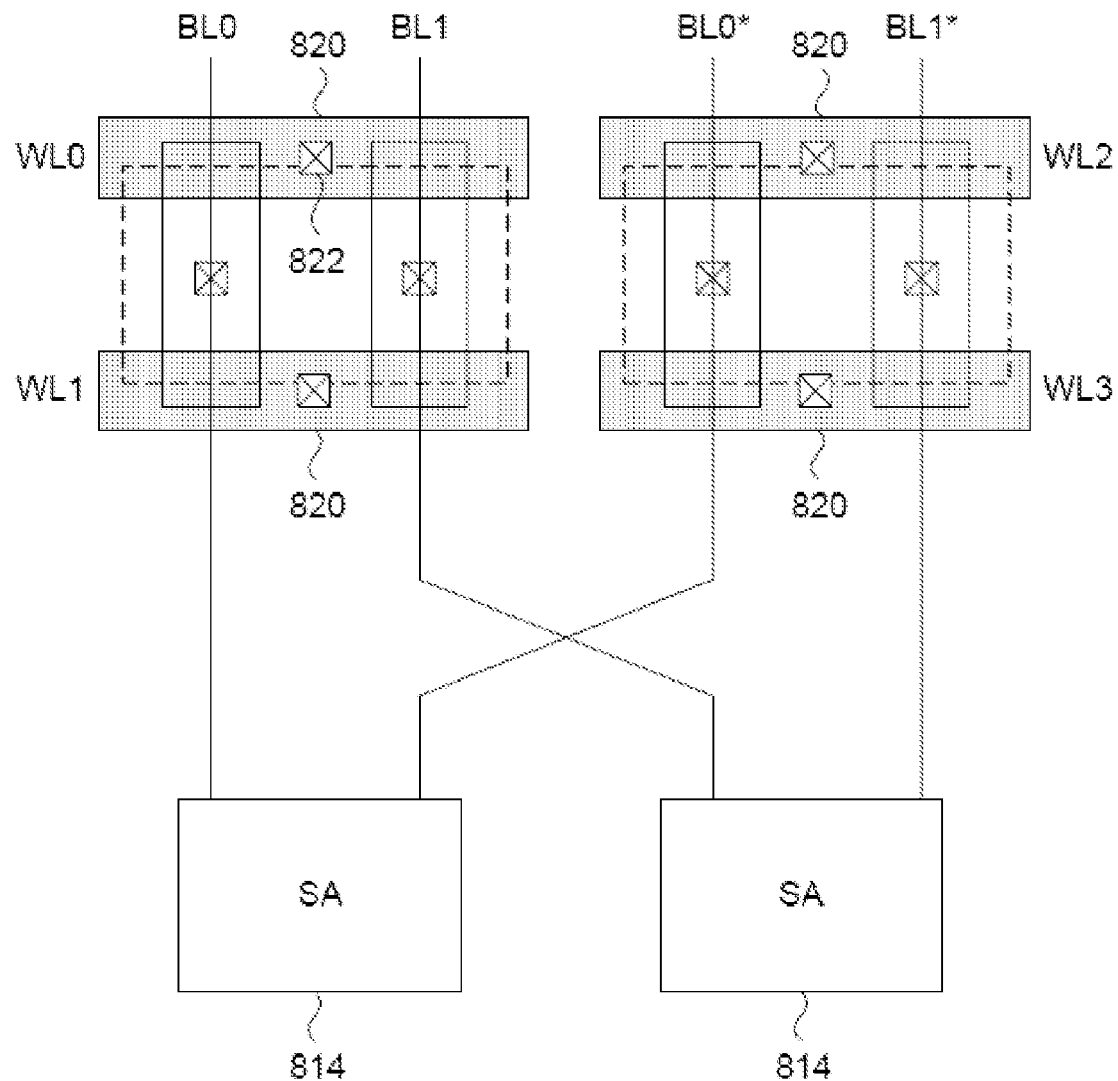
FIG. 14 is a layout of anti-fuse transistors employing wordline segments according to an embodiment of the present invention; and, FIG. 15 is a circuit diagram of a combined sense and programming circuit according to an embodiment of the present invention.

FIG. 14 illustrates an alternate differential cell arrangement according to another embodiment of the present invention. The anti-fuse transistor cells shown are identical to those shown in FIG. 12, but are now arranged such that the polysilicon wordlines are broken into segments 820, where each segment 820 is coupled to two different anti-fuse transistor cells. Alternatively, the anti-fuse transistor pair shown in FIG. 8 can be used here as well. The segments can be connected to metal wordlines through wordline contact 822 via intermediate metal lines as required. It is well known in the art that the combination of metal wordlines connected to polysilicon wordline segments improves overall performance of the memory array. The particular arrangement shown in FIG. 14 enables single-ended sensing or dual-ended sensing of the bitlines by configuring the wordline decoders. In other words, the wordline drivers can be controlled dynamically to drive only one wordline or two wordlines simultaneously in similar fashion to the DRAM decoder shown in issued U.S. Pat. No. 6,549,483. In the current application however, the single ended mode is used for a non-volatile memory cell test, and program and verify operations, whereas the dual ended mode is used for normal read operations only. Such a combination allows for independent sensing optimization for read, test and verify, resulting in greatly improved read margins. The details of the single ended sensing mode will be described later.

Figure 15:
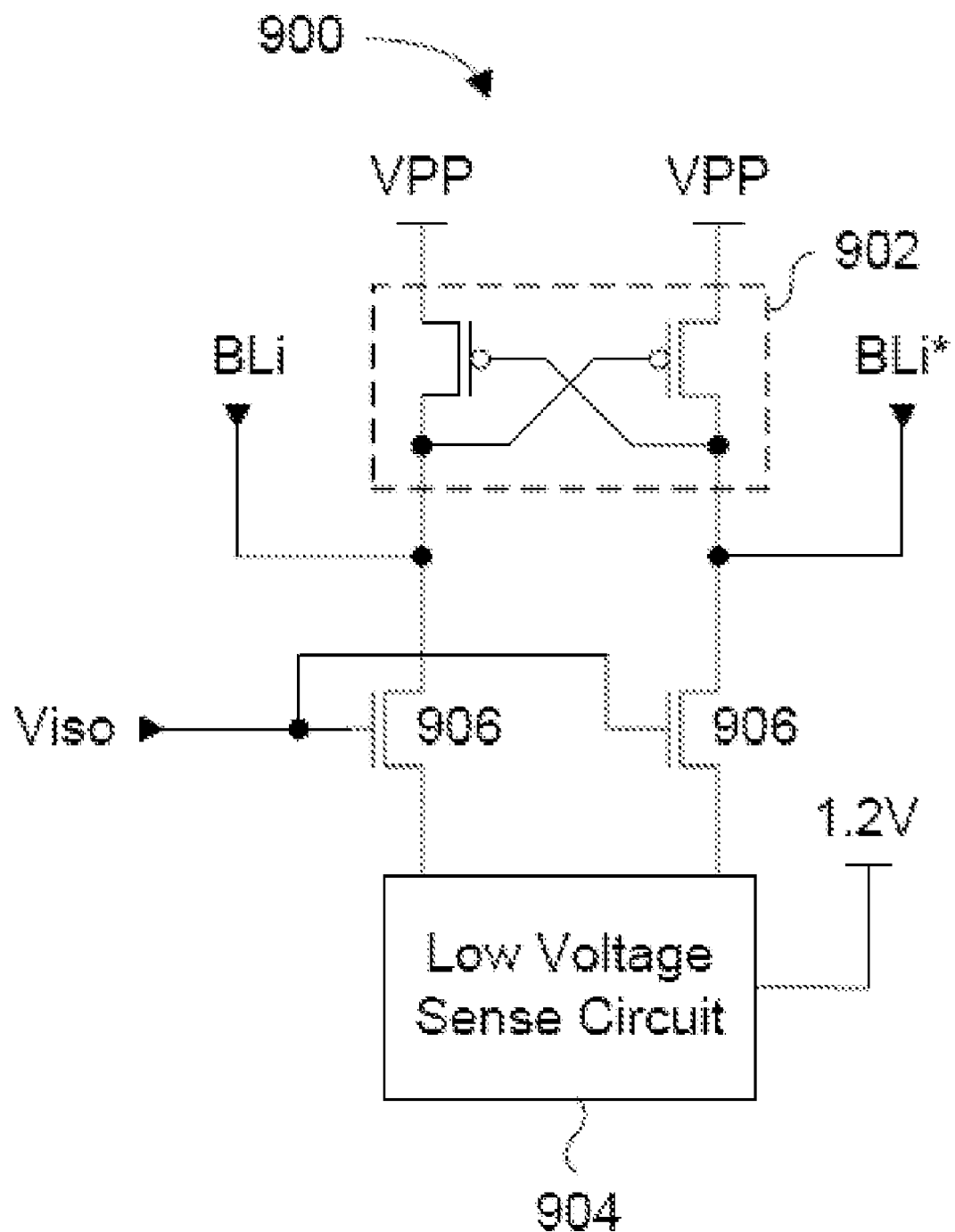

According to an embodiment of the present invention, programming circuits can be incorporated with the sensing circuit of the differential sense amplifier circuit. FIG. 15 is a circuit diagram of an embodiment of such a circuit for n-type antifuse. Sense/program circuit 900 includes a high voltage cross-coupled p-type latch circuit 902 and a low voltage sense circuit 904 separated by thick gate oxide isolation transistors 906 controlled by Viso. Viso is preferably a variable voltage signal, such that Viso can be less than VDD for data verification after programming to limit current draw. The cross-coupled latch circuit 902 receives VPP or another program blocking voltage, and each branch of the latch circuit 902 is connected to a complementary pair of bitlines BLi/BLi*, while the sense circuit 904 receives a 1.2V supply voltage. Viso is preferably set to a maximum voltage level of about VDD+Vt=1.8V to isolate the more sensitive sense circuit transistors from the VPP voltage.

In a programming operation, sense circuit 904 receives write data, which is coupled to latch circuit 902 via activated isolation transistors 906. Latch circuit 902 effectively performs a level shift of the 1.2V data to VPP, which is then driven onto the appropriate bitline. Furthermore, during read operation the back bias connection is preferably maintained at a high voltage, while the supply voltage is kept at or below VDD to turn off the high voltage PMOS transistors at all times.

As was mentioned earlier, the prior art sensing methods allow for reliable sensing of the anti-fuse memory array according to the present invention, but testing of the un-programmed array is compromised and testing of the OFF- and ON-resistance is difficult. Therefore there is a need for an improved and more compact sensing and testing method.

This is accomplished in the present invention by a new OTP-DRAM sensing scheme, as it would be applied to n-type anti-fuse transistor embodiments of the present invention. In addition to the regular OTP memory array, one or more rows, and if needed one or more columns of DRAM reference cells are added. These cells are used as short term DRAM memory for testing row and column decoders. In addition, the DRAM cells can be precharged to a tightly controlled voltage (either external or internally generated) and activated in parallel with the OTP cells either on the true or on the complementary bit line, allowing for very precise control of additional charge injected to the bit lines during the sense operation. A typical DRAM differential sense technique is used. For example, the bitlines are precharged to VDD and the DRAM cells are precharged to a reference voltage level such as VSS. Next, two word lines are activated, one OTP word line and one DRAM word line. Assuming the bitlines are balanced, a negative charge is injected from the DRAM cell to the complementary bitline and the OTP cell is connected to the true bitline. If the OTP cell was not programmed, the true bit line will remain positively charged and will be sensed as such by the sense amplifier. But if the cell was programmed, the true bit line will be discharged towards ground and sensed as low. Controlling the amount of charge in the DRAM cell and the time for bitline evaluation allows for precise testing of the relative resistance of the cell, whether it is programmed or not. It should be noted that this method can be used for single ended OTP read, or for margining the dual ended OTP read. The retention of DRAM cells is not essential for the basic read operations and should not affect memory yield. The DRAM reference cells according to present invention are preferably included within the OTP memory array for enhanced testing capability.

Alternately, instead of using DRAM cells, the true bitline capacitance can be increased. This can be done "for free" in a cross-point array architecture where the Y-decoder can connect just a single bitline to the differential sense amplifier. For stability, the other node of the sense amplifier should be connected to a small capacitor, called a stability capacitor. This stability capacitor is preferably chosen such that if the cell is not programmed, the sense amplifier will always be skewed to flip in one direction. However, if the cell is programmed and the bitline is discharged to a certain level, the sense amplifier will flip in the opposite direction.

The previously described embodiments of the anti-fuse transistor can be fabricated using standard CMOS processes, where its specific structures can be formed by simple mask manipulation. Accordingly, the above-described anti-fuse transistors and memory array can be manufactured at low cost either as p-type or n-type antifuses.

While the embodiments of the present invention are described with respect to single polysilicon gate anti-fuse transistor cells, the aforementioned teachings can apply to metal gate devices, and dual-gate structures similar to that shown in FIGS. 2 and 3. In such an embodiment, the gate 14 would be formed over a thick gate oxide portion, while top plate 16 would be formed over a thin gate oxide portion. Oxide breakdown is enhanced through the previously discussed techniques, such as high voltage diffusion doping and salicidation with RPO formation. Accordingly, the fusible edge would be located at the common edge of the thick gate oxide under top plate 16 and diffusion region 22, while the access edge would be located at the common edge of the thin oxide under gate 14 and diffusion region 24.

Those skilled in the art will understand that the invention equally applies to all other bulk MOS, thin film and SOI technologies including DRAM, EPROM, EEPROM and Flash, using either SiO2 or other gate dielectrics. Furthermore, persons of skill in the art can easily adopt the previously described p-channel devices to n-channel devices, either using isolated p-well and negative bias, or utilizing positive voltages only.

The anti-fuse structures of present invention can be utilized in all one time programmable applications, including RF-ID tags. RF-ID tagging applications are gaining more acceptance in the industry, particularly in sales, security, transport, logistics, and military applications for example. The simplicity and full CMOS compatibility of the presently described anti-fuse transistor invention allows for application of the RF-ID tag concept to integrated circuit manufacturing and testing process. Therefore, IC manufacturing productivity can be increased by utilizing the split-channel anti-fuse tag in combination with an RF communication interface on every wafer and/or every die on the wafer allowing for contact-less programming and reading chip specific or wafer specific information during IC manufacturing and packaging, as well as during printed circuit board assembly.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method of forming a variable thickness gate oxide for an anti-fuse transistor having a channel region and a diffusion region, comprising the steps of:
   a) forming a field oxide surrounding the channel region and the diffusion region;
   b) growing an intermediate oxide in the channel region;
   c) removing the intermediate oxide from a thin oxide region of the channel region;
   d) growing a thin oxide over the thin oxide region and the intermediate oxide;
   e) forming a common gate over the thin oxide, the intermediate oxide and the field oxide; and,
   f) forming the diffusion region adjacent the intermediate oxide.

2. The method of claim 1, wherein the anti-fuse transistor and one low voltage transistor are formed on a semiconductor material, the low voltage transistor having a dielectric structure being the same as the thin oxide.

3. The method of claim 1, wherein the step of forming the diffusion region includes simultaneously forming a floating diffusion region adjacent the thin oxide region.

4. The method of claim 1, wherein the intermediate oxide extends from a first edge of the common gate to a predetermined length of the channel region, and the thin gate oxide over the thin oxide region extends from the predetermined length of the channel region to a second edge of the common gate.

5. The method of claim 4, wherein said predetermined length is defined through a masking step.

6. The method of claim 1, wherein the thin oxide is formed with the same process steps as for forming a low voltage transistor gate oxide on the same semiconductor material.

7. The method of claim 1, wherein a thick oxide consisting of the thin oxide and the intermediate oxide is formed with the same process steps as for forming a high voltage transistor gate oxide on the same semiconductor material.

8. The method of claim 1, further including the steps of
   selectively growing a salicidation protect oxide over the diffusion region; and,
   saliciding a portion of the common gate and the diffusion region.

* * * * *